(12) United States Patent
Zhang et al.

(10) Patent No.: US 10,418,536 B2
(45) Date of Patent: Sep. 17, 2019

(54) LED METAL SUBSTRATE AND LED MODULE

(71) Applicant: KAISTAR LIGHTING (XIAMEN) CO., LTD., Xiamen (CN)

(72) Inventors: Jingqiong Zhang, Xiamen (CN); Shanshan Yang, Xiamen (CN); Jinqiang Huang, Xiamen (CN)

(73) Assignee: KAISTAR LIGHTING (XIAMEN) CO., LTD., Xiamen (CN)

( * ) Notice: Subject to any disclaimer, the term of this patent is extended or adjusted under 35 U.S.C. 154(b) by 35 days.

(21) Appl. No.: 15/691,680

(22) Filed: Aug. 30, 2017

(65) Prior Publication Data

US 2018/0062055 A1    Mar. 1, 2018

(30) Foreign Application Priority Data

Aug. 31, 2016    (CN) .......................... 2016 1 0786000

(51) Int. Cl.
*H01L 33/00*        (2010.01)
*H01L 33/62*        (2010.01)
(Continued)

(52) U.S. Cl.
CPC .............. *H01L 33/62* (2013.01); *H01L 23/58* (2013.01); *H01L 23/49827* (2013.01); *H01L 23/49838* (2013.01); *H01L 33/644* (2013.01)

(58) Field of Classification Search
CPC ....... H01L 33/62; H01L 33/644; H01L 23/58; H01L 23/49838; H01L 23/49827;
(Continued)

(56) References Cited

U.S. PATENT DOCUMENTS

| 7,948,076 B2* | 5/2011 | Wang ................. H01L 23/3677 257/707 |
| 9,893,039 B2* | 2/2018 | West .................... H01L 25/0753 |
| 2009/0194783 A1 | 8/2009 | Takemoto et al. .............. 257/98 |

FOREIGN PATENT DOCUMENTS

| CN | 2645244 Y | 9/2004 |
| CN | 2010072763 Y | 6/2008 |

(Continued)

OTHER PUBLICATIONS

The Chinese First Examination Report of corresponding China patent application No. 201610786000.8, dated Feb. 27, 2018.

*Primary Examiner* — Robert G Bachner
(74) *Attorney, Agent, or Firm* — WPAT, PC

(57) ABSTRACT

The present disclosure provides a LED metal substrate and a LED module. An insulator is provided to cover an electrode or a side surface of a metal layer in the LED metal substrate, or provided on an original creepage path between the electrode and the metal layer in the LED metal substrate to form a new creepage path with increased creepage distance, in order to increase the breakdown voltage between the electrode and the metal layer. It is possible to avoid a phenomenon that an electric arc is generated between the electrode and the metal layer when a relative high voltage applied by the electrode during a breakdown test. So that the breakdown voltage of the LED metal substrate with an insulator reaches higher than that of a LED metal substrate without the insulator in the same dimension, and a technical problem in the art may be solved.

12 Claims, 7 Drawing Sheets

(51) Int. Cl.
  *H01L 23/58* (2006.01)
  *H01L 23/498* (2006.01)
  *H01L 33/64* (2010.01)
(58) Field of Classification Search
  CPC .................. H01L 33/64; H01L 33/647; H01L 2933/0075; H01L 2933/0033
  See application file for complete search history.

(56) References Cited

FOREIGN PATENT DOCUMENTS

| | | |
|---|---|---|
| CN | 204857771 U | 12/2015 |
| CN | 205985477 U | 2/2017 |

* cited by examiner

LED METAL SUBSTRATE AND LED MODULE

CROSS-REFERENCE TO RELATED APPLICATIONS

This application is based on and claims priority to Chinese Patent Application No. 201610786000.8, filed on Aug. 31, 2016, the full disclosure of which is hereby incorporated by reference in its entirety.

TECHNICAL FIELD

The present disclosure relates to afield of electronic manufacture technology, and particularly to a LED metal substrate and a LED module.

BACKGROUND

A LED metal substrate includes two parts of a LED chip and a metal core substrate. The LED chip is attached onto the metal core substrate and then the LED chip is subject to bonding, so that the LED chip is electrically connected to a circuit on the metal core substrate. Such LED metal substrate may be generally referred as a chip on board (COB).

Because such LED metal substrate may be mainly mounted in lighting, the LED metal substrate may be required to meet requirements of light efficiency and a safety requirement of lighting. Regarding the safety of lighting, breakdown voltage is one of indexes of safety and mainly used to indicate a performance for preventing electric breakdown. The breakdown voltage and the performance of preventing electric breakdown increase gradually as the level of breakdown voltage increases from level 0, to level I, and then to level II.

It is found that there is defect in the prior art that, it is difficult to increase the breakdown voltage of the prior LED metal substrate to high level due to the limitation on the dimension of the LED metal substrate.

SUMMARY

The embodiments of the present disclosure provide a LED metal substrate and a LED module so as to increase breakdown voltage in the prior art without increasing the dimension of the LED metal substrate.

To achieve the above technical objects, the embodiments of the present disclosure provide technical solutions as follows.

Embodiments of the present disclosure provide a LED metal substrate including: a metal core substrate and a first insulator; the metal core substrate is provided with an electrode on upper surface thereof, the electrode welded with an electrical wire is covered with the first insulator on outer surface thereof.

More particularly, when the breakdown voltage of the LED metal substrate reaches level I, the thickness of the first insulator is greater than 0.2 mm; and when the breakdown voltage of the LED metal substrate reaches level II, the thickness of the first insulator is greater than 0.4 mm.

More particularly, the metal core substrate is provided with a via hole, a sidewall of the via hole is covered with insulative glue or an insulative sleeve; wherein the breakdown voltage of the LED metal substrate reaches level I in condition of the distance between the via hole and the electrode being less than 2 mm; or the breakdown voltage of the LED metal substrate reaches level II in condition of distance between the via hole and the electrode being less than 5.5 mm.

Embodiments of the present disclosure provide a LED metal substrate including: a metal core substrate and a second insulator; the metal core substrate includes a circuit layer and a metal layer insulated from the circuit layer; the second insulator is provided on an outer surface of the metal core substrate and located on an original creepage path between an electrode of the circuit layer and the metal layer to form a new creepage path.

More particularly, the second insulator is provided on a part of the upper surface of the metal core substrate where the original creepage path goes through, an upper surface of the second insulator is higher than an upper surface of the electrode, one side surface of the second insulator is flush with a side of the electrode, and another side surface of the second insulator is flush with a side surface of the metal layer.

More particularly, when the breakdown voltage of the LED metal substrate reaches level I, the new creepage distance is greater than 2 mm; and when the breakdown voltage of the LED metal substrate reaches level II, the new creepage distance is greater than 5.5 mm.

More particularly, the second insulator is a tetragonal prism with a bottom surface thereof attached to the metal core substrate; then the new creepage distance is calculated according to the following formula: $d=a+2b$, wherein a is a width of the bottom surface of the second insulator, and b is a height of the second insulator.

More particularly, a surface of the second insulator may be provided with at least one groove; wherein an opening width of the groove along a surface of the second insulator is greater than 1 mm.

Embodiments of the present disclosure provide a LED metal substrate including a metal core substrate and a third insulator; an electrode is provided on an upper surface of the metal core substrate; a bottom layer of the metal core substrate is a metal layer, the third insulator covers a side surface of the metal layer which is close to the electrode.

More particularly, an upper surface of the third insulator is higher than an upper surface of the metal layer; and/or a bottom surface of the third insulator is lower than a bottom surface of the metal layer.

Embodiments of the present disclosure provide a LED module including the LED metal substrate; and a connector; the LED metal substrate including a metal core substrate and a third insulator; an first electrode is provided on an upper surface of the metal core substrate; a bottom layer of the metal core substrate is a metal layer, the third insulator covers a side surface of the metal layer which is close to the electrode; the connector includes an insulator body and a second electrode provided on an upper surface of the insulator body, the second electrode is electrically connected with the first electrode of the LED metal substrate, the insulator body is provided with a concave for accommodating the LED metal substrate on a bottom surface thereof, and a sidewall of the concave groove is attached to the third insulator of the LED metal substrate.

More particularly, the bottom surface of the connector is fixed to a metal heat sink; the surface of the second electrode is covered with a fourth insulator; wherein when the breakdown voltage of the LED module reaches level I, the thickness of the fourth insulator is greater than 0.2 mm; and when the breakdown voltage of the LED module reaches level II, the thickness of the fourth insulator is greater than 0.4 mm.

More particularly, a bottom surface of the connector is fixed to a metal heat sink; the connector further includes a fifth insulator provided on an outer surface of the connector, the fifth insulator is provided on an upper surface of the connector and located on an original creepage path between the second electrode and the metal heat sink to form a new creepage path, one side surface of the fifth insulator is flush with the second electrode, and another side surface is flush with a side surface of the connector.

More particularly, when the breakdown voltage of the LED module reaches level I, the new creepage distance between the second electrode and the metal heat sink is greater than 2 mm; and when the breakdown voltage of the LED metal substrate reaches level II, the new creepage distance between the second electrode and the metal heat sink is greater than 5.5 mm.

More particularly, the fifth insulator may be a tetragonal prism with a bottom surface thereof attached to the upper surface of the connector; then the new creepage distance d may be calculated according to the following formula: $d=c+2e+h$, wherein c is a width of a bottom surface of the fifth insulator, e is a height of the fifth insulator, and h is a height of the connector.

The LED metal substrate and the LED module provided by the embodiments of the present disclosure may provide an insulator to cover an electrode or a side surface of a metal layer in the LED metal substrate, or provide an insulator on an original creepage path between the electrode and the metal layer to form a new creepage path with increased creepage distance, in order to increase the breakdown voltage between the electrode and the metal layer. It is possible to avoid a phenomenon that an electric arc is generated between the electrode and the metal layer when a relative high voltage applied by the electrode during a breakdown test. So that the breakdown voltage of the LED metal substrate with an insulator reaches higher than that of a LED metal substrate without the insulator in the same dimension, and a technical problem in the art may be solved.

The above description is merely a brief introduction of the technical solutions of the present disclosure, so that the technical means of the present disclosure may be clearly understood, and implemented according to the description of the specification, and the above and other technical objects, features and advantages of the present disclosure may be more obvious based on the embodiments of the present disclosure as follows.

BRIEF DESCRIPTION OF THE DRAWINGS

A variety of other advantages and benefits would be clear and obvious to skills in the art upon reading following preferable embodiments. Drawings are merely used to illustrate preferable embodiments and should not be regarded as limitation on the present disclosure. Furthermore, same reference numbers are used to represent same or similar components throughout drawings, in which.

DESCRIPTION OF THE EMBODIMENTS

Figure 1:
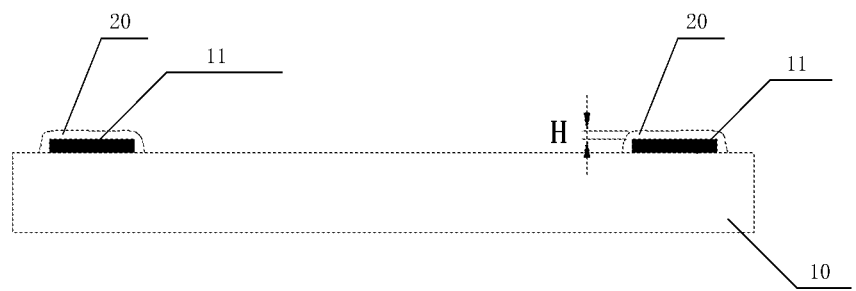
FIG. 1 is a structural schematic diagram of a LED metal substrate provided by a first embodiment of the present disclosure.

In the following, description will be given in detail on the exemplary embodiments of the present disclosure, in connection with the accompanying drawing. Although drawings show the exemplary embodiments of the present disclosure, it should be understood that the present disclosure may be implemented in various ways without being limited by the embodiments set forth herein. On the contrary, these embodiments are provided for thorough understanding of the present disclosure, and completely conveying the scope of the present disclosure to the skills in the art.

For convenience in understanding embodiments of the present disclosure, brief explanation would be made on terms recited in the embodiments of the present disclosure as follows.

Breakdown voltage: breakdown voltage is an index in the procedure of performing safety test and used to indicate a performance for prevent electric shock. The breakdown voltage may be classified by three levels of level 0, level I, and level II, and the higher the level of the breakdown voltage is, the higher the performance of preventing electric shock is, and the more strict standard used when safety test is performed for breakdown voltage test is. More particularly, taking lighting as an example, correspondence between the level of breakdown voltage and standard for breakdown voltage test may be shown in a following table.

TABLE 1

Level of breakdown voltage vs standard for breakdown voltage test

| Level of breakdown voltage | Definition | Standard for breakdown voltage test |
|---|---|---|
| 0 | A lighting only uses functional insulation as protection measure against electrical shock | 2 U + 1000 V |
| I | A lighting uses protection measures such as grounding in addition to using functional insulation as protection measure against electrical shock | 2 U + 1750 V |
| II | A lighting uses double insulation or enhanced insulation as protection measures against electrical shock, with insulation effect does not depend on grounding or installation condition | 4 U + 2750 V |

Creepage distance: a length of the shortest path where an electrical arc of insulation surface between two conductive components goes, which has a value equal to the shortest distance measured along a surface of insulation material between two conductive components or one conductive component and an apparatus and accessible surface.

LED metal substrate: including two parts of a LED chip and a metal core substrate, wherein the LED chip is subjected to bonding so as to accomplish an electrical connection of the LED chip after the LED chip is attached onto the metal core substrate.

Connector: a device configured to connect a LED metal substrate and a power adapter.

LED module: a lighting module consisted of a LED metal substrate and a connector.

Brief explanation is only made to terms above, and further explanation would be made to terms in connection with embodiments in the following.

UL certification and CE certification are two common certifications on safety. In order to gain these two certifications, it is necessary for a product to pass a safety test of relatively high standard. Regarding breakdown voltage as one of performance indexes of safety test, during breakdown voltage test on LED metal substrate and LED module, it is found that it is difficult for prior LED metal substrate and LED module to reach high level breakdown voltage required for UL certification and CE certification due to the limitation on the dimension of the LED metal substrate. The breakdown voltage is required to reach level I for UL certification, while the breakdown voltage is required to reach level II for CE certification. However, the prior LED metal substrate and LED module have breakdown voltage only equal to level 0 for the requirement of both high power and small dimension. With study on LED metal substrate and LED module, it is found that an electrical arc may be easily generated due to short creepage distance between a metal layer and an electrode of a LED metal substrate, which leads to the defect on breakdown voltage of LED metal substrate and LED module. Therefore, it is proposed to insulatively cover the metal layer and electrode of a LED metal substrate or increase the creepage distance between the metal layer and electrode of a LED metal substrate, so as to improve breakdown voltage of LED metal substrate and LED module.

Detailed description would be made on the LED metal substrate and LED module provided by the embodiments of the present disclosure in connection with drawings in the following.

First Embodiment

The present embodiment mainly focuses on a method of insulatively covering an electrode on the LED metal substrate to improve breakdown voltage of the LED metal substrate. To distinguish the insulator cited in the present embodiment from the insulator cited in other embodiments, the insulator cited in the present embodiment may be referred as a first insulator.

FIG. 1 is a structural schematic diagram of a LED metal substrate provided by a first embodiment of the present disclosure. As shown in FIG. 1, the LED metal substrate includes a metal core substrate 10 and a first insulator 20.

An electrode 11 may be provided on an upper surface of the metal core substrate 10 and the electrode 11 welded with conductive wire is covered with the first insulator 20 on an outer surface thereof.

It should be noted that, as shown in FIG. 1, the outer surface of the electrode 11 as recited herein refers to an exposed charged surface of the electrode 11 welded with conductive wire. Therefore, the part covered by the first insulator 20 may generally include an upper surface and a side of the electrode 11.

Figure 2:
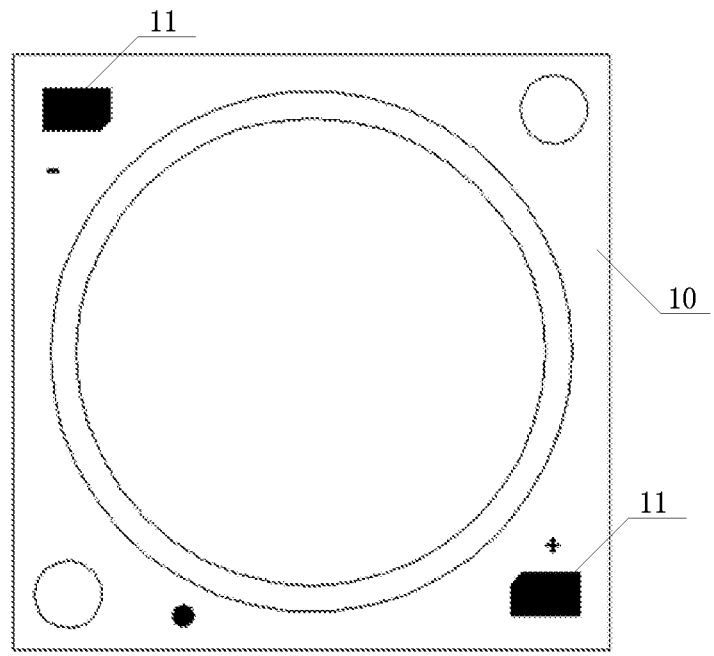
FIG. 2 is a top-view of the metal core substrate 10.
Figure 3:
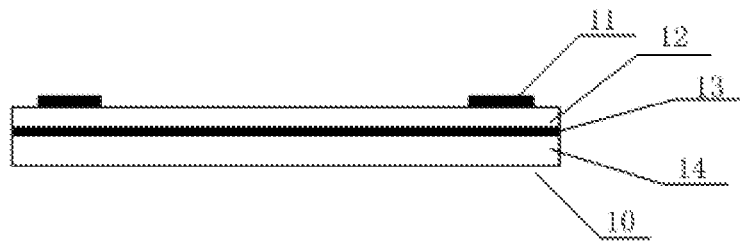
FIG. 3 is a structural schematic diagram of the metal core substrate 10.

More particularly, FIGS. 2 and 3 are schematic views of the metal core substrate 10. As shown in FIG. 2, the metal core substrate 10 is provided with an electrode 11 on an upper surface thereof. Furthermore, as shown in FIG. 3, the metal core substrate 10 include at least three layers from top to bottom, i.e., a circuit layer 12, an insulation layer 13, and a metal layer 14. More particularly, the insulation layer 13 is configured to insulate a bottom surface of the circuit layer 12 from an upper surface of the metal layer 14. However, there is an exposed charged electrode 11 provided on an upper surface of the circuit layer 12 so that during a breakdown voltage test, an electrical arc may be easily generated between the electrode 11 and a side of the metal layer 14. With the first insulator 20 provided by the present embodiment of the present disclosure, as shown in FIG. 1, the outer surface of the electrode 11 of the metal core substrate 10 is covered with the first insulator 20 so as to avoid electrical arc generated between the electrode 11 and the metal layer 14 of the metal core substrate 10, so that the breakdown voltage of the LED metal substrate is improved.

A thickness of the first insulator 20 directly matters the degree for improving the breakdown voltage of the LED metal substrate. In the prior art, the breakdown voltage of the LED metal substrate is generally level 0, and if it is necessary to improve the breakdown voltage of the LED metal substrate to level I, a thickness H of the first insulator 20 may be at least 0.2 mm; and if it is necessary to improve the breakdown voltage of the LED metal substrate to level II, the thickness H of the first insulator 20 may be at least 0.4 mm.

For a better breakdown voltage, the first insulator 20 can be closely attached to the electrode 11, so as to avoid discharging by an electrical arc through a gap between the first insulator 20 and the electrode 11, which degrades the breakdown voltage of the LED metal substrate. Preferably, insulation adhesive such as silica adhesive or epoxy adhesive may be covered on surface of the electrode 11 by dispensing or spraying adhesive on surface of the electrode 11, and curing the insulation adhesive to form the first insulator 20 on surface of the electrode 11. It is necessary to cover the whole outer surface of electrode 11 with the first insulator 20, and thus attention may be paid on dispensing amount and area of spread insulation adhesive after being dispensed, when dispensing insulation adhesive. Similarly, attention may be paid on amount of adhesive in single spraying and numbers of spraying so as to ensure that the charged part of electrode 11 may be unexposed, when spraying the insulation adhesive.

Generally, the LED metal substrate does not include a power supply circuit, and thus the electrode 11 on the LED metal substrate needs a wire to connect with a power supply circuit outside, so as to supply power to the LED chip on the LED metal substrate. More particularly, as an example, the electrode 11 may be fixedly connected with a wire by welding the electrode 11 and the wire together, so that the first insulator 20 covers the outer surface of the electrode 11 and it is also necessary for the first insulator 20 to cover the fixed connection point of the electrode 11 and the wire, i.e., a position of welding point, and extend to an edge of insulation sleeve of the wire so as to avoid electrical arc generated by discharging at the border of the electrode 11 and the wire.

As another example, it is necessary for the LED metal substrate to be fixed to the mounting surface by screws and via holes need to be provided on the LED metal substrate so that screws may go through the LED metal substrate to be connected with the mounting surface. When a distance between via hole and the electrode 11 is short, it is necessary to insulatively cover the sidewall of the via hole, so as to avoid electrical arc generated between the electrode 11 and metal layer 14 of the sidewall of the via hole. When the sidewall of the via hole is insulatively covered, insulation adhesive or adhesive sleeve may be used to cover the sidewall of the via hole, so as to improve breakdown voltage between the electrode 11 and the metal layer 14 at the via hole.

More particularly, not only a distance between a via hole and the electrode 11 but also a breakdown voltage required by the LED metal substrate is to be considered when deciding whether or not it is necessary to insulatively cover the sidewall of the via hole. More particularly, the sidewall of the via hole needs to be insulatively covered so as to avoid electrical arc generated between the electrode 11 and the metal layer 14 of the sidewall of the via hole.

The LED metal substrate provided by the embodiments of the present disclosure may provide an insulator to cover an electrode in the LED metal substrate. It is possible to avoid an phenomenon that an electric arc may be generated between the electrode and the metal layer when a relative high voltage applied by the electrode during a breakdown test, so that breakdown voltage of the LED metal substrate may be improved and a technical problem in the art that the breakdown voltage of the metal core substrate is poor may be solved.

Second Embodiment

Figure 4:
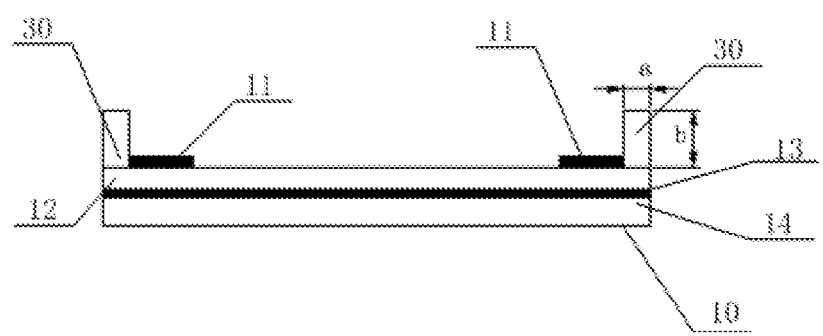
FIG. 4 is a structural schematic diagram of a LED metal substrate provided by a second embodiment of the present disclosure.

FIG. 4 is a structural schematic diagram of a LED metal substrate provided by a second embodiment of the present disclosure. As shown in FIG. 4, the LED metal substrate includes a metal core substrate 10 and a second insulator 30.

More particularly, the structure of the metal core substrate 10 may refer to related detailed description about FIG. 3 in the first embodiment, and description may be omitted to avoid redundancy.

The second insulator 30 in the present embodiment may be provided on an outer surface of the metal core substrate 10 and located on a creepage path between an electrode 11 of a circuit layer 12 and a metal layer 14.

The creepage path is generally the shortest path between the electrode 11 and the metal layer 14 on the outer surface of the metal core substrate 10. The creepage distance as a distance of the creepage path has a positive correlation with the breakdown voltage. Therefore it is necessary to set the second insulator 30 on the original creepage path to form a new one between the electrode 11 and the metal layer 14, so as to increase a creepage distance between the electrode 11 and the metal layer 14, to improve the breakdown voltage of the LED metal substrate.

The increased creepage distance of the second insulator 30 directly matters the degree for improving the breakdown voltage of the LED metal substrate, and the more the creepage distance increases, the higher the breakdown voltage is. For example, when the LED metal substrate has a breakdown voltage level of level I, the creepage distance between the electrode 11 and the metal layer 14 may be increased to 2 mm by the second insulator 30; when the LED metal substrate has a breakdown voltage level of level II, the creepage space between the electrode 11 and the metal layer 14 may be increased to 5.5 mm by the second insulator 30.

The second insulator 30 may be particularly provided at a part where the creepage path goes through on an upper surface of the metal core substrate 10, with one side of the second insulator near the electrode 11 and another side of the second insulator near an edge of the metal layer 14. To increase the creepage distance, the second insulator 30 may have a certain height and the upper surface of the second insulator 30 may be at least higher than an upper surface of the electrode 11 so that the higher the second insulator 30 is, the more the creepage distance increases.

As an example, the second insulator 30 is a tetragonal prism, and is provided on the part of the upper surface of the metal core substrate 10 where the creepage path goes through. A bottom surface of the tetragonal prism is attached to the upper surface of the circuit layer 12. Aside of the second insulator 30 is flush with the electrode 11, and another side of the second insulator 30 flushes with a side surface of the metal layer 14. As shown in FIG. 4, the creepage distance between the electrode 11 and the metal layer 14 may be calculated according to the following formula: $d=a+2b$, wherein a is a width of the bottom surface of the second insulator 30, b is a height of the second insulator 30, and d is the creepage distance.

As an example, in some cases, the LED metal substrate may have a compact structure and thus there is limited space for containing the second insulator 30. In such a case, a groove may be provided on a surface of the second insulator 30 so as to increase the creepage distance. When an opening width of the groove along a surface of the second insulator 30 is equal to or smaller than 1 mm, the electrical arc may directly go across the groove without going through the bottom of the groove and the purpose of increasing the creepage distance may be failed. Therefore, when it is necessary to increase the creepage distance, the opening width of the groove along a surface of the second insulator 30 can be greater than 1 mm.

Figure 5:
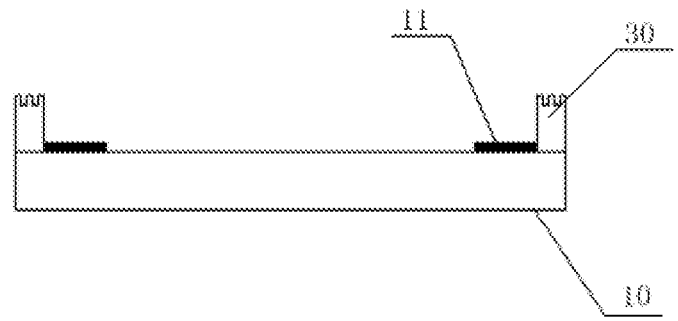
FIG. 5 is a structural schematic diagram of a groove.
Figure 6:
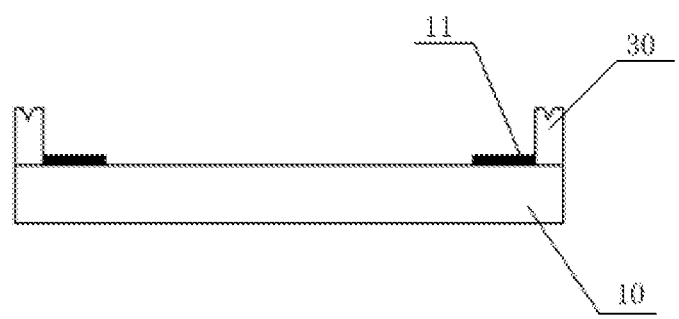
FIG. 6 is another structural schematic diagram of a groove.
Figure 7:
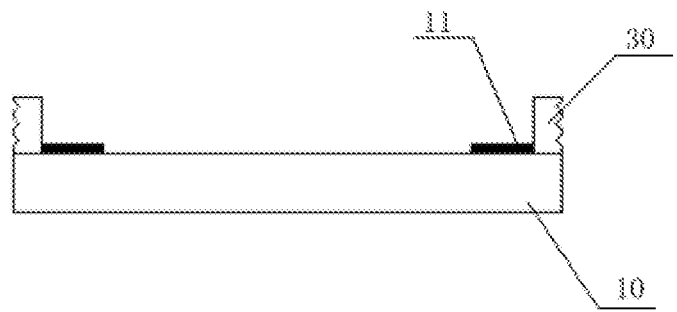
FIG. 7 is still another structural schematic diagram of a groove.

Specific position for providing grooves and specific shape and position of grooves may refer to the grooves as shown in FIG. 5 to FIG. 7. For example, the shape of the groove may be V-shape or right-angle-shape, and the position of the groove may be on the upper surface or the side surface of the second insulator 30. There is no limitation on it in the present embodiment. When the opening width of the groove along a surface of the second insulator 30 is greater than 1 mm, the deeper the groove is, the more the creepage distance increases, so that the more the breakdown voltage of the LED metal substrate increases.

The LED metal substrate provided by the embodiments of the present disclosure may provide an insulator on the creepage path between the metal layer and the electrode in the LED metal substrate, in order to increase the creepage distance between the electrode and the metal layer. It is possible to avoid an phenomenon that an electric arc may be generated between the electrode and the metal layer when a relative high voltage applied by the electrode during a breakdown test, so that the breakdown voltage of the LED metal substrate may be improved and a technical problem in the art that the breakdown voltage of the metal core substrate is poor may be solved.

Third Embodiment

Figure 8:
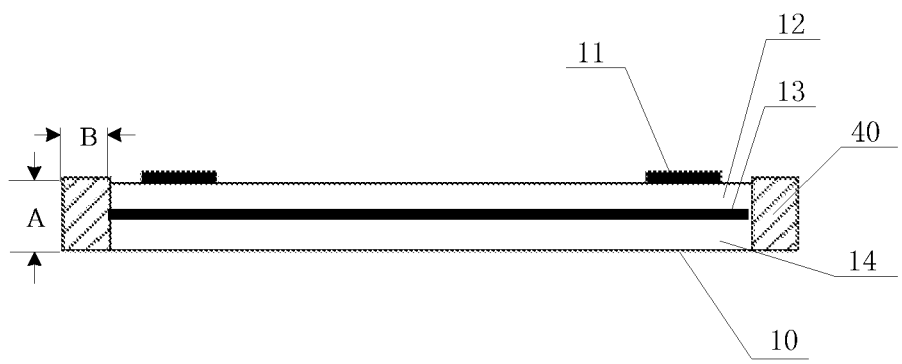
FIG. 8 is a structural schematic diagram of a LED metal substrate provided by a third embodiment of the present disclosure.

FIG. 8 is a structural schematic diagram of a LED metal substrate provided by a third embodiment of the present disclosure. As shown in FIG. 8, the LED metal substrate includes a metal core substrate 10 and a third insulator 40.

More particularly, the structure of the metal core substrate 10 may refer to related detailed description about FIG. 2 in the first embodiment, and description may be omitted to avoid redundancy.

The third insulator 40 in the present embodiment covers a part of the metal layer 14 of the metal core substrate 10, i.e., a side of the metal layer 14. In order to prevent electrical arc generated between the electrode 11 and the metal layer 14, in the present embodiment, aside of the metal layer 14 is covered by the third insulator 40 so as to so as to avoid electrical arc generated between the metal layer 14 and the electrode 11 and improve the breakdown voltage of the LED metal substrate. More particularly, when a side surface of the metal layer 14 is fixedly connected with an insulated surface, insulation can be ensured between the metal layer 14 and the electrode 11.

In order that the breakdown voltage of the LED metal substrate can reach level I or level II, the third insulator 40 may have a certain thickness, which is at least equal to or greater than a thickness of the metal core substrate 10, so that the third insulator 40 may cover all the side of the metal core substrate 10. However, in the present embodiment, there is no limitation on whether or not the upper surface or the bottom surface of the third insulator 40 is beyond a surface of the metal core substrate 10, or flushes with the surface of the metal core substrate 10. Preferably, an upper surface of the third insulator 40 may be higher than an upper surface of the metal layer 14, and meanwhile, the bottom surface of the third insulator 40 may be lower than the bottom surface of the metal layer 14.

More particularly, in an application case of lighting, a LED metal substrate may be mounted inside or outside of the lighting as a light source and a bottom surface of the metal core substrate 10 may contact a metal mounting surface after the installation. In such case, as shown in FIG. 8, calculation may be performed according to the following formula: $d=A+B$, wherein A is a height of side of the third insulator 40, B is a width of the third insulator, d is a creepage distance so that the creepage distance between the electrode 11 and a metal mounting surface may be obtained by such calculation. B may be at least 0.2 mm if the breakdown voltage of the lighting applying the LED metal substrate 10 is increased to level I; and B may be at least 0.4 mm if the breakdown voltage of the lighting applying the LED metal substrate 10 is increased to level II.

The creepage distance between the electrode 11 and a metal mounting surface which the LED metal substrate 10 mounted on increased by the third insulator 40 directly matters the degree for improving the breakdown voltage of the LED metal substrate. The more the creepage distance increases, the higher the breakdown voltage is. For example, when the breakdown voltage of the lighting applying the LED metal substrate is level I, the creepage distance d between the electrode 11 and a metal mounting surface which the LED metal substrate 10 mounted on may be increased to at least 2 mm by the third insulator 40; when the breakdown voltage of the lighting applying the LED metal substrate is level II, the creepage distance d between the electrode 11 and a metal mounting surface which the LED metal substrate 10 mounted on may be increased to at least 5.5 mm by the third insulator 40.

The LED metal substrate provided by the embodiments of the present disclosure may provide an insulator to cover a sidewall of the metal layer in the LED metal substrate, in order to insulate the metal layer. It is possible to avoid an phenomenon that an electric arc may be generated between the electrode and the metal layer when a relative high voltage applied by the electrode during a breakdown test, so that a breakdown voltage of the LED metal substrate may be improved and a technical problem in the art that the breakdown voltage of the metal core substrate is poor may be solved.

Fourth Embodiment

Figure 9:
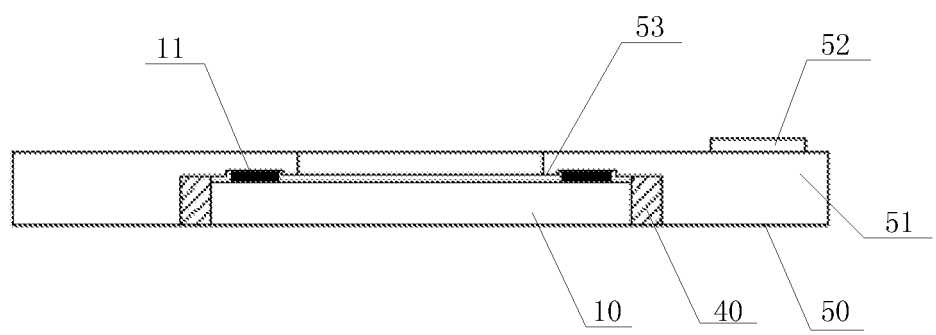
FIG. 9 is a structural schematic diagram of a LED module provided by a fourth embodiment of the present disclosure.

Based on the LED metal substrate provided by the third embodiment, the present embodiment provides a LED module. FIG. 9 is a structural schematic diagram of a LED module provided by a fourth embodiment of the present disclosure. As shown in FIG. 9, the LED module includes a connector 50, and the LED metal substrate provided by the third embodiment.

The LED metal substrate and the connector are both provided with electrodes therein, and thus in order to distinguish the electrode of the LED metal substrate and the electrode of the connector, in the present embodiment, the electrode of the LED metal substrate mentioned in the third embodiment is referred as the first electrode 11, while the electrode of the connector 50 is referred as the second electrode 52. That is to say, the electrode 11 in FIG. 9 and the electrode 11 in FIG. 8 refer to the same electrode.

Figure 10:
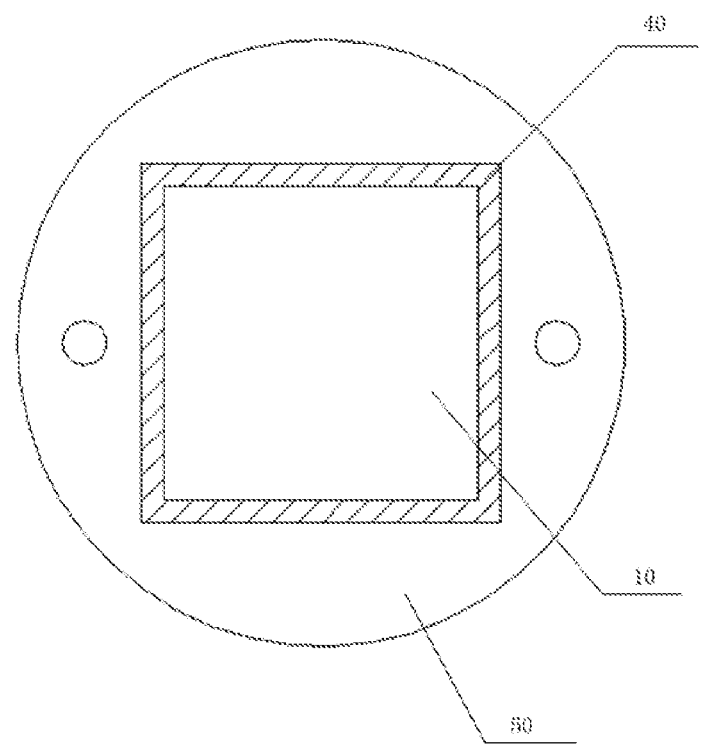
FIG. 10 is a bottom-view of the LED module.
Figure 11:
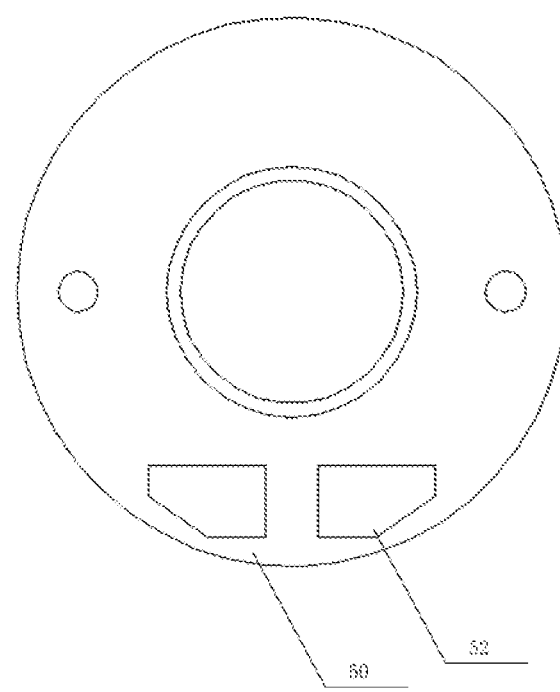
FIG. 11 is a top-view of the LED module.

As shown in FIG. 9, the connector 50 includes an insulation body 51 and a second electrode 52 provided on the insulation body 51. The second electrode 52 is electrically connected with the first electrode 11 of the LED metal substrate. The insulation body 51 is provided, on a bottom surface thereof, with a concave 53 configured to contain a conductive electrode of the connector 50 and metal matter (such as solder paste, solder sheet, or the like) of the first electrode 11, and such concave 53 may be some space left due to the requirement of assembling. The sidewall of the concave 53 is attached to the third insulator 40 of the LED metal substrate, so that it can be seen that a third insulator 40 is filled between the metal core substrate 10 and the connector 50 in the top view of FIG. 10 and bottom view of FIG. 11.

To prevent electrical arc generated between the first electrode 11 and the bottom surface of the metal layer 14 during the test for breakdown voltage, a third insulator 40 may be filled in the gap between the metal core substrate 10 and the connector 50 so as to prevent electrical arc generated in the gap between the metal core substrate 10 and the connector 50.

Meanwhile, during the test for breakdown voltage, it is also necessary to prevent electrical arc generated between the first electrode 11 and a side of the metal layer 14. Although the third insulator 40 has covered all the side of the metal layer 14, when the testing voltage for breakdown voltage is high, breakdown may easily happen between an edge position of the metal layer 14 near the first electrode 11 and the first electrode 11 during the test for breakdown voltage so that the upper surface of the third insulator 40 may be attached to the bottom surface of the concave 53 of the connector 50 so as to increase the thickness of the third insulator 40 covered by the metal layer 14. For example, it may be necessary for the third insulator 40 to encapsulate the metal core substrate 10, and the thickness of the third insulator 40 may be at least 0.2 mm if the breakdown voltage of the LED metal substrate is increased to level I; and the thickness of the third insulator 40 may be at least 0.4 mm if the breakdown voltage of the LED metal substrate is increased to level II.

The LED module provided by the embodiments of the present disclosure may provide an insulator to cover the sidewall of the metal layer in the LED metal substrate, in order to insulate the metal layer. It is possible to avoid an phenomenon that an electric arc is generated between the electrode and the metal layer when a voltage applied by the electrode during a breakdown test, so that a breakdown voltage of the LED metal substrate may be improved and a technical problem in the art that the breakdown voltage of the metal core substrate is poor may be solved.

Fifth Embodiment

Based on the LED module provided by the fourth embodiment, the present embodiment makes improvement against the problem that the breakdown voltage is degraded due to the fixed connection between the LED module and a metal heat sink.

Figure 12:
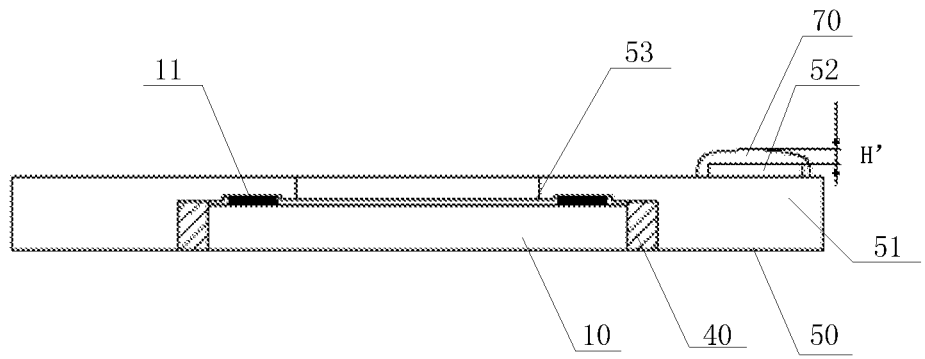
FIG. 12 is a structural schematic diagram of a LED module provided by a fifth embodiment of the present disclosure.

FIG. 12 is a structural schematic diagram of a LED module provided by a fifth embodiment of the present disclosure. As shown in FIG. 12, the bottom surface of the connector 50 is fixedly connected with the metal heat sink, and a second electrode 52 is covered with a fourth insulator 70 on a surface thereof.

It can be found that the degradation of the breakdown voltage due to the fixed connection between the LED module and the metal heat sink is caused by the electrical arc generated between the second electrode 52 of the connector 50 and the metal heat sink. Therefore, in the present embodiment, such electrical arc may be prevented by insulatively covering the second electrode 52.

More particularly, the thickness of the fourth insulator 70 directly matters the degree for improving the breakdown voltage of the LED module. The thickness H' of the fourth insulator 70 may be at least 0.2 mm if the breakdown voltage of the LED module is increased to level I; and the thickness H' of the fourth insulator 70 may be at least 0.4 mm if the breakdown voltage of the LED module is increased to level II.

A LED module normally does not contain a power supply circuit, and thus, it may be necessary for the second electrode 52 on the LED module to be externally connected with a power supply circuit via wires, so as to be connected to the first electrode 11 via the second electrode 52 to supply power to the LED chip on the LED metal substrate. More particularly, as an example, the second electrode 52 may be fixedly connected with wires by welding the second electrode 52 and the wires so that the fourth insulator 70 covers outer surface of the second electrode 52 and it is also necessary for the fourth insulator 70 to further cover the fixedly connected point, i.e., the position of welding spot, and extend to the edge of the insulation sleeve of the wires so as to prevent electrical arc generated at the connection spot of the second electrode 52 and wires.

The LED module provided by the embodiments of the present disclosure may provide an insulator to cover second electrode, in order to insulate the second electrode. It is possible to avoid an phenomenon that an electric arc may be generated between the electrode and the metal layer when a voltage applied by the second electrode during a breakdown test, so that a breakdown voltage of the LED metal substrate may be improved and a technical problem in the art that the breakdown voltage of the metal core substrate is poor may be solved.

Sixth Embodiment

Based on the LED module provided by the fourth embodiment, the present embodiment makes another improvement against the problem that the breakdown voltage is degraded due to the fixed connection between the LED module and a metal heat sink.

Figure 13:
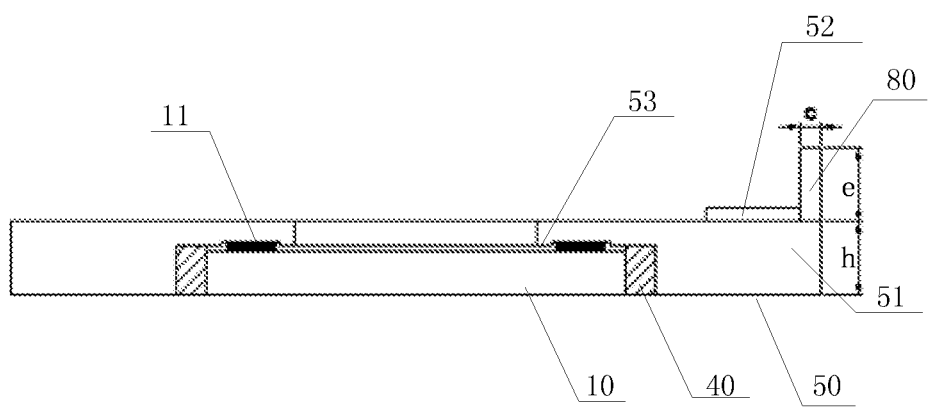
FIG. 13 is a structural schematic diagram of a LED module provided by a sixth embodiment of the present disclosure.

FIG. 13 is a structural schematic diagram of a LED module provided by a sixth embodiment of the present disclosure. As shown in FIG. 13, the bottom surface of the connector 50 is fixed to the metal heat sink, and the connector 50 further includes a fifth insulator 80 provided on an outer surface of the connector. The fifth insulator 80 is located on a creepage path between the second electrode 52 and the metal heat sink.

The creepage path is normally the shortest path between the second electrode 52 and the metal heat sink on the outer surface of the connector 50. So that it is necessary for the fifth insulator 80 to be provided on the original creepage path to form a new one between the second electrode 52 and the metal heat sink to improve the breakdown voltage of the LED module.

The increased creepage distance of the fifth insulator 80 directly matters the degree for improving the breakdown voltage of the LED module. The more the creepage distance increases, the higher the breakdown voltage is. For example, the creepage distance between the second electrode 52 and the metal heat sink may be increased to at least 2 mm by the fifth insulator 80, if the breakdown voltage of the LED module is level I; and the creepage distance between the second electrode 52 and the metal heat sink may be increased to at least 5.5 mm by the fifth insulator 80, if the breakdown voltage of the LED module is level II.

The fifth insulator 80 may be provided on a part on the connector 50 where the creepage path goes through. One side of the fifth insulator 80 may be close to the second electrode 50, while another side may be close to an edge of the connector 50. To increase creepage distance, the fifth insulator 80 may have a certain height and the upper surface of the fifth insulator 80 may be at least higher than the upper surface of the second electrode 52 so that the higher the fifth insulator 80 is, the more the creepage distance increases.

More particularly, the fifth insulator 80 is a tetragonal prism and provided at a part of the upper surface of the connector 50 where the creepage path goes through. A bottom surface of the tetragonal prism is attached to the upper surface of the connector 50, and one side of the fifth insulator 80 is attached to the second electrode 52, and another side of the fifth insulator 80 flushes with a side of the connector 50. As shown in FIG. 13, a creepage distance d may be calculated according to the following formula: $d=c+2e+h$ so as to obtain the creepage distance between the second electrode 52 and the metal heat sink 60, wherein c is a bottom width of the fifth insulator 80, e is a height of the fifth insulator 80, and h is a height of the connector 50.

More particularly, the LED module may have a compact structure and thus there is limited space for containing the fifth insulator 80. In such case, a groove may be provided on a surface of the fifth insulator 80 so as to increase the creepage distance. When an opening width of the groove along a surface of the fifth insulator 80 is equal to or smaller than 1 mm, the electrical arc may directly go across the groove without going through the bottom of the groove and the purpose of increasing the creepage distance may be failed. Therefore, when it is necessary to increase the creepage distance, the opening width of the groove along a surface of the fifth insulator 80 can be greater than 1 mm. The detailed forms for providing grooves may refer to related description in FIG. 5-FIG. 7 and the first embodiment and the detailed description may be omitted in the present embodiment so as to avoid redundancy.

The LED module provided by the embodiments of the present disclosure may provide an insulator on a creepage path between the second electrode and the metal heat sink so as to increase the creepage distance between the second electrode and the metal heat sink. It is possible to avoid an phenomenon that an electric arc may be generated between the electrode and the metal layer when a voltage applied by the second electrode is relative high during a breakdown test, so that a breakdown voltage of the LED metal substrate may be improved and a technical problem in the art that the breakdown voltage of the metal core substrate is poor may be solved.

It should be noted that the foregoing embodiments are merely used to illustrate the technical solution of the present disclosure, and not to limit the present disclosure. Although the present disclosure has been described in detail with reference to the foregoing embodiments, one skilled in the art would understand that the technical solutions recited in the foregoing embodiments may be modified or all or a part of the technical features may be replaced equally. These modifications and replacements are not intended to make corresponding technical solution depart from the scope of the technical solution of embodiments of the present disclosure.

What is claimed is:

1. A LED metal substrate, comprising:
a metal core substrate; and
a second insulator,
wherein the metal core substrate comprises a circuit layer, and a metal layer insulated from the circuit layer, and the second insulator is provided on an outer surface of the metal core substrate and located on an original creepage path between an electrode of the circuit layer and the metal layer to form a new creepage path.

2. The LED metal substrate according to claim 1, the second insulator is provided on a part of the upper surface of the metal core substrate where the original creepage path goes through, an upper surface of the second insulator is higher than an upper surface of the electrode, one side of the second insulator is flush with a side of the electrode, and another side of the second insulator is flush with a side of the metal layer.

3. The LED metal substrate according to claim 2, wherein when a breakdown voltage of the LED metal substrate reaches level I, the new creepage distance is greater than 2 mm; and
when the breakdown voltage of the LED metal substrate reaches level II, the new creepage distance is greater than 5.5 mm.

4. The LED metal substrate according to claim 3, wherein the second insulator is a tetragonal prism with a bottom surface thereof attached to the metal core substrate,
then the new creepage distance through the outer surface of the second insulator is calculated according to the following formula:
$d=a+2b$, wherein a is a width of the bottom surface of the second insulator, and b is a height of the second insulator.

5. The LED metal substrate according to claim 1, wherein a surface of the second insulator is provided with at least one groove, wherein an opening width of the groove along a surface of the second insulator is greater than 1 mm.

6. A LED metal substrate, comprising:
a metal core substrate; and
a third insulator,
wherein a top layer of the metal substrate is a circuit layer, which is provided with a first electrode on a upper surface thereof, a bottom layer of the metal substrate is a metal layer, which is covered with the third insulator on a side located on an original creepage path between the first electrode and the metal layer thereof.

7. The LED metal substrate according to claim 6, wherein an upper surface of the third insulator is higher than an upper surface of the metal layer, and/or
a bottom surface of the third insulator is lower than a bottom surface of the metal layer.

8. A LED module, comprising:
a LED metal substrate; and
a connector,
wherein the LED metal substrate including a metal core substrate and a third insulator; a top layer of the metal substrate is a circuit layer, which is provided with a first electrode on a upper surface thereof, a bottom layer of the metal substrate is a metal layer, which is covered with the third insulator on a side located on an original creepage path between the first electrode and the metal layer thereof; and
wherein the connector comprises an insulator body and a second electrode provided on an upper surface of the insulator body, the second electrode is electrically connected with the first electrode of the LED metal substrate, the insulator body is provided with a concave for accommodating the LED metal substrate on a bottom surface thereof, and a sidewall of the concave groove is attached to the third insulator of the LED metal substrate.

9. The LED module according to claim 8, wherein the bottom surface of the connector is fixed to a metal heat sink, the surface of the second electrode is covered with a fourth insulator,
wherein when a breakdown voltage of the LED module reaches level I, the thickness of the fourth insulator is greater than 0.2 mm; and
when the breakdown voltage of the LED module reaches level II, the thickness of the fourth insulator is greater than 0.4 mm.

10. The LED module according to claim 8, wherein a bottom surface of the connector is fixed to a metal heat sink, the connector further comprises a fifth insulator provided on an outer surface of the connector, the fifth insulator is provided on an upper surface of the connector and located on an original creepage path between the second electrode and the metal heat sink to form a new creepage path, one side of the fifth insulator is flush with the second electrode, and another side is flush with a side of the connector.

11. A LED module according to claim 10, wherein
when the breakdown voltage of the LED module reaches level I, the new creepage distance between the second electrode and the metal heat sink is greater than 2 mm; and
when the breakdown voltage of the LED metal substrate reaches level II, the new creepage distance between the second electrode and the metal heat sink is greater than 5.5 mm.

12. The LED module according to claim 11, wherein the fifth insulator is a tetragonal prism with a bottom surface thereof attached to the upper surface of the connector,
then the new creepage distance d is calculated according to the following formula:
$d=c+2e+h$, wherein c is a width of a bottom surface of the fifth insulator, e is a height of the fifth insulator, and h is a height of the connector.

* * * * *